United States Patent [19]

Sridhar

[11] Patent Number: 5,119,166
[45] Date of Patent: Jun. 2, 1992

[54] HALL EFFECT ELEMENT ALIGNED TO REDUCE PACKAGE-INDUCED OFFSETS

[75] Inventor: Uppili Sridhar, Garland, Tex.

[73] Assignee: Honeywell Inc., Minneapolis, Minn.

[21] Appl. No.: 475,859

[22] Filed: Feb. 6, 1990

[51] Int. Cl.⁵ .................. H01L 29/04; H01L 27/22; H01L 29/66; H01L 29/82
[52] U.S. Cl. .................. 357/60; 357/25; 357/27; 128/789
[58] Field of Search ............ 357/5, 60, 27; 128/789

[56] References Cited

U.S. PATENT DOCUMENTS

| | | | |
|---|---|---|---|
| 3,994,010 | 11/1976 | Geske | 357/27 |
| 4,315,273 | 2/1982 | Yamamoto et al. | 357/60 |
| 4,317,126 | 2/1982 | Gragg, Jr. | 357/60 |
| 4,423,434 | 12/1983 | Komatsu | 357/60 |
| 4,673,964 | 6/1987 | Popovic et al. | 357/27 |
| 4,739,381 | 4/1988 | Miura et al. | 357/60 |

FOREIGN PATENT DOCUMENTS

| | | | |
|---|---|---|---|
| 56-58290 | 5/1981 | Japan | 357/27 |
| 58-137774 | 8/1983 | Japan | 357/27 |

OTHER PUBLICATIONS

Kanda et al "Silicon Hall-Effect Power IC's for Brushless Motors" *IEEE Transactions on Electron Dev.* vol. ED-29 (1) (Jan. 1982) pp. 151-154.

Kanda "A Graphical Representative of the Piezoresistance Coefficients in Silicon" *IEEE Transac. on Electron Dev.* vol. ED'29 (1) (Jan. 1982).

Kanda et al "Effect of Mechanical Stress on the Offset Voltages of Hall Devices in Si IC" *Phys. Stat. Sol.(a)* vol. 35:K115 (1976).

Tuft and Long et al "Recent Developments in Semiconductor Piezoresistive Devices" *Solid State Electronics* vol. 6 p. 23 (1963).

*Primary Examiner*—Andrew J. James
*Assistant Examiner*—Daniel N. Russell
*Attorney, Agent, or Firm*—Richards, Medlock & Andrews

[57] ABSTRACT

Disclosed is a Hall effect element formed in a single crystal semiconductor chip with the direction of bias current flow aligned parallel with the <100> cyrstallographic direction and also parallel with edges of the chip. The orientation described is selected to minimize piezoresistive effects produced by packaging-induced physical stress on the semiconductor chip.

9 Claims, 2 Drawing Sheets

HALL EFFECT ELEMENT ALIGNED TO REDUCE PACKAGE-INDUCED OFFSETS

BACKGROUND OF THE INVENTION

1. Field of the Invention

This invention relates to Hall effect semiconductor devices. More particularly, it relates to methods of manufacturing Hall effect devices which minimize introduction of offset voltages resulting from piezoresistance effects induced by device packaging.

2. Description of the Prior Art

Various semiconductor devices have been designed, fabricated and mass-produced utilizing the well known Hall effect. For example, Hall effect switches and the like commonly employ a silicon body through which a bias current is passed between two spaced apart contacts or terminals. Sensing terminals are positioned on opposite sides of the bias current path and spaced equidistant from the two spaced apart bias current input terminals to detect a voltage potential in a direction perpendicular to the bias current path. Ideally, zero potential is developed between the sensing terminals in the absence of a magnetic field. Unfortunately, the ideal condition is seldom achievable in the real world because of various factors other than Hall effect.

One of the most significant factors contributing to non-ideal performance of Hall effect devices is the piezoresistance sensitivity of semiconductor materials such as silicon. For example, most semiconductor devices must be encapsulated in a suitable housing or package for protection of the semiconductor element. The semiconductor device is typically mounted on a substrate and encapsulated in a protective body such as epoxy, plastic or the like. Since the mounting substrate and the encapsulation material generally have different coefficients of thermal expansion and elastic moduli which are also different from the coefficient of thermal expansion and elastic modulus of silicon, mounting and encapsulation of the silicon chip place mechanical stresses on the chip. Since silicon is piezoresistive, physical stresses placed on the chip alter its electrical resistance characteristics resulting in voltage offsets produced by mechanical stress rather than Hall effect.

Prior attempts to minimize voltage offsets resulting from mechanical stress generally concentrated on reduction of mechanical stress. Thus encapsulation materials and mounting techniques have been developed which reduce (but not eliminate) mechanical stress. Unfortunately, such encapsulation materials and mounting techniques are generally expensive and thus add considerably to the production cost of the devices. Attempts have also been made to predetermine predictable stress effects and orient the Hall element with respect to the crystallographic orientation of the chip to minimize stress effects and/or provide trimming resistors to compensate for piezoresistance effects. While these approaches are somewhat satisfactory for gross adjustments to predeterminable voltage offsets, they suffer from lack of reproducibility and sensitivity to packaging process parameters and, of course, trimming resistors formed in the integrated circuit chip cannot be used to further adjust voltage offsets after the device has been encapsulated.

SUMMARY OF THE INVENTION

In accordance with the present invention voltage offsets resulting from mechanical stress are minimized by orientation of the Hall element with respect to direction of bias current flow, crystallographic orientation and predeterminable stress factors. Device configuration is selected so that the bias current flow is parallel with physical edges of the semiconductor chip and also in the <100> crystallographic direction. By selection of device configuration to conform to these parameters, sensitivity to piezoresistive effects in the Hall element are minimized, thereby avoiding or at least minimizing packaging-induced voltage offsets. Therefore, by control of device configuration reliably reproducible Hall effect devices may be produced which exhibit consistently predictable offset voltages (or zero offset voltages) independent of packaging considerations.

BRIEF DESCRIPTION OF THE DRAWING

Other features and advantages of the invention will become more readily understood from the following detailed description taken in connection with the appended claims and attached drawing in which:

FIG. 3 is a sectional view of an integrated circuit chip mounted on a substrate and encapsulated in plastic or the like.

DESCRIPTION OF THE PREFERRED EMBODIMENTS

In conventional manufacturing techniques for integrated circuits including a Hall effect element such as a switch or the like, multiple circuits are formed simultaneously on the surface of a single crystal wafer. For purposes of mechanical handling during processing and crystallographic considerations, the surface of the wafer lies approximately 4° off the <111>, <110> or <100> orientation.

Layout of components on the surface of an integrated circuit chip involves may considerations, not the least of which is component density. In order to maximize density of components, most circuit designers arrange component devices in rectangular configurations aligned with the edges of the rectangular chip.

The relationship between offset voltage and shear stress in a thin layer of N-type silicon on a larger supporting body is represented as $$V_o \propto \pi_{44}(\Sigma_{xx} - \Sigma_{yy})2\sin\theta$$

where $\pi_{44}$ is the piezoresistance-shear stress coefficient, $\Sigma_{xx}$ is the principal longitudinal compressive (or tensile) stress, $\Sigma_{yy}$ is the principal transverse compressive (or tensile) stress, and $\theta$ is the angle between the direction of bias current flow and the direction of compressive (or tensile) stress applied.

It is well known that $\pi_{44}$ is minimum when Hall effect bias current flow is parallel with the <100> crystallographic direction. Therefore, in order to minimize offset voltage resulting from piezoresistance effects, circuit designers conventionally orient Hall effect elements so that the bias current flow is parallel with the <100> crystallographic direction.

Figure 1:
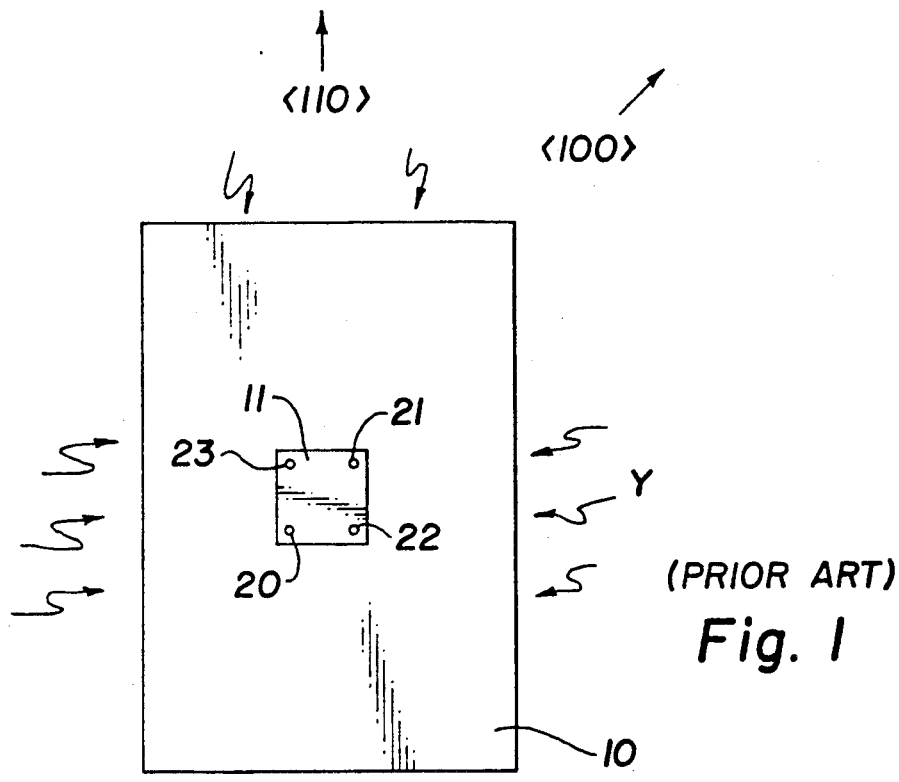
FIG. 1 is a top plan view of a typical conventional integrated circuit chip illustrating the device configuration and orientation of a Hall effect element formed therein.

A typical integrated circuit chip containing a Hall effect element is illustrated in FIG. 1. The chip comprises a single crystal chip body 10 with a Hall effect element 11 formed therein. The Hall effect element, as well as other circuit components, are formed by conventional masking, diffusion and pattern formation techniques which are well known in the art and form no part of this invention. Therefore, for purposes of clarity of illustration only the Hall element 11 is illustrated.

Figure 2:
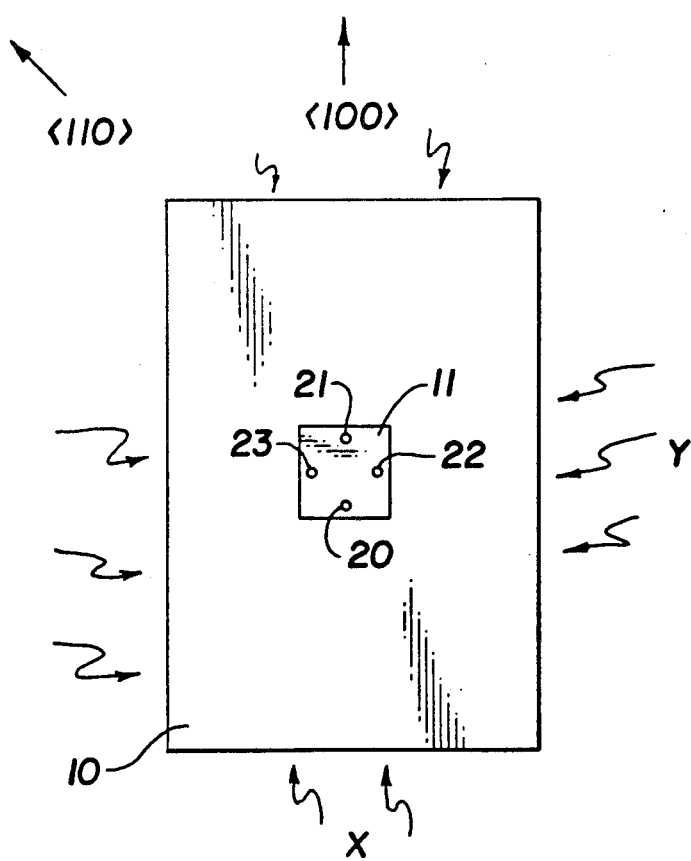
FIG. 2 is a top plan view of an integrated circuit chip illustrating the device configuration and orientation of a Hall effect element formed therein in accordance with the preferred embodiment of the present invention.
Figure 3:
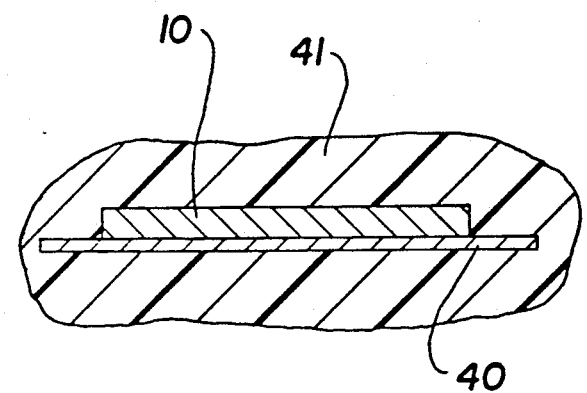

An integrated circuit chip as illustrated in FIG. 1 is typically packaged as illustrated in FIG. 3. The chip 10 is secured to a supporting substrate 40 such as a lead frame or the like and the device then encapsulated in a body 41 of epoxy, plastic or the like. Since the chip 10, the substrate 40 and the encapsulation body 41 all have different coefficients of thermal expansion and elastic moduli; and since the encapsulation process usually involves molding the plastic body at elevated temperatures, the chip 10 is subjected to physical stresses in the final product. Since the chip is rectangular in major dimensions, the stresses are primarily longitudinal and transverse compressive (or tensile) stresses perpendicular to the edges of the chip. These stresses are diagrammatically illustrated by the crooked arrows in FIG. 1 and FIG. 2.

The Hall effect element 11 is typically square in plan dimensions and, for component density considerations, aligned with its edges parallel with the edges of the chip 10. The bias current input/output terminals 20, 21 are precisely positioned at opposite diagonal corners. Thus bias current flows along a path between terminals 20 and 21 in a direction which is parallel with the <100> direction and thus 45° from the <110> direction as illustrated by the straight arrows. However, longitudinal compressive stresses X and transverse compressive stresses Y as illustrated by the crooked arrows are applied perpendicular to the edges and thus are applied at an angle of 45° to the direction of bias current flow. Because of asymmetric configuration of the substrate 40 and/or the encapsulation material 41, stresses will be applied perpendicular to the edges of the rectangular chip 10. Thus, either longitudinal or transverse stresses will predominate. Such stresses, however, will be applied to the chip at an angle of 45° from the direction of bias current flow. Thus, the 2 sin $\theta$ portion of the voltage offset relationship expressed above is disadvantageously at the maximum value.

Multiple integrated circuit chips are formed simultaneously on the surface of a single crystal wafer. The single crystal wafer ordinarily has an orientation flat on one edge to identify the <100> face. Since $\pi_{44}$ is minimum when bias current flows parallel with the <100> direction, circuit designers orient the production masking, etc., 45° from the <100> flat, i.e., so that the edges of each chip are parallel with the <110> crystallographic direction. This insures that the Hall effect bias current, which flows in a direction 45° from the chip edge when flowing between terminals 20 and 21, is always parallel with the <100> direction. While this arrangement is advantageous for obtaining a minimum value of $\pi_{44}$, it fails to consider two major factors. First, $V_o$ is the product of $\pi_{44}$ and $(\Sigma_{xx} - \Sigma_{yy})$ 2 sin $\theta$. Thus, unless stress on the chip 10 is symmetrical and the Hall effect element symmetrical and perfectly centered, $\Sigma_{xx} - \Sigma_{yy}$ can become a significant factor. Secondly, although bias current flow is parallel with the <100> direction, it is 45° from the edge of the chip 10. Since X and Y stresses are perpendicular to the chip edges, $\Sigma_{xx} - \Sigma_{yy}$ results in a stress which is predominantly perpendicular to the edges. Thus $\theta$ is 45° and results in a shear stress in which 2 sin $\theta$ is the largest number possible.

The preferred embodiment of the invention is illustrated in FIG. 2. In the preferred embodiment chip orientation is rotated 45° so that the edges of the chip 10 are aligned parallel with the <100> crystallographic direction rather than the <110> direction. As in the device of FIG. 1, the Hall effect element 11 is square in plan dimensions with its edges aligned parallel with the edges of chip 10. However, bias current input/output terminals 20, 21 are positioned to define a current path therebetween which is also parallel with the edges of chip 10 as well as parallel with the <100> crystallographic direction. To accomplish this arrangement, the bias current input/output terminals 20 and 21 are not positioned at diagonal corners of the Hall effect element 11. Instead, they are positioned substantially equidistant from the corners of the Hall effect element and adjacent opposite edges thereof. As in the conventional device illustrated in FIG. 1, the voltage potential sensing terminals 22 and 23 are positioned equidistant from the bias current input/output terminals 20 and 21 and on opposite sides of the bias current path defined by terminals 20, 21. However, since the bias current input/output terminals 20, 21 are positioned equidistant from the corners of Hall effect element 11, the voltage potential sensing terminals 22, 23 are likewise positioned equidistant from the corners of the Hall effect element 11.

It will be noted that the chip 10 of FIG. 2 is subjected to the same longitudinal stresses X and transverse stresses Y as the chip of FIG. 1 when encapsulated. However, since the chip is rectangular and the compressive stresses are applied perpendicular to the edges of the chip, the stresses are applied either parallel with the direction of current flow or 90° from the direction of current flow. Accordingly, regardless of the predominant direction of stress applied perpendicular to an edge, no shear stress is applied at a 45° angle to the direction of current flow. Thus, the 2 sin $\theta$ factor of the offset voltage expression set forth above is minimized.

Figure 4:
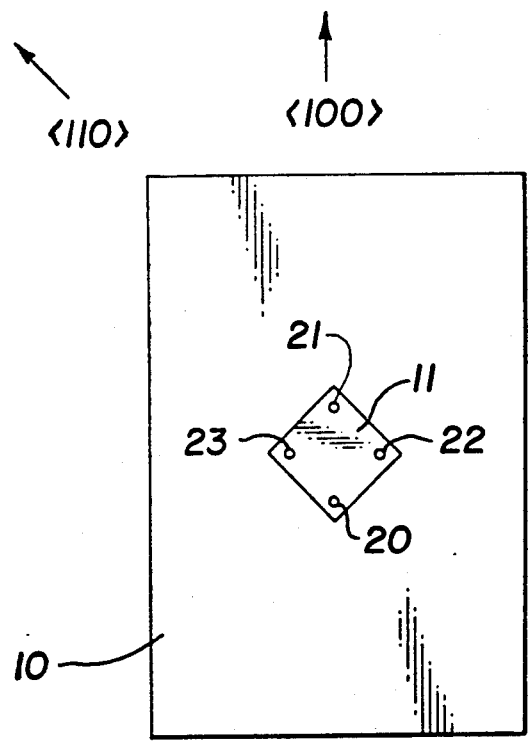
FIG. 4 is a top plan view of an integrated circuit chip illustrating the device configuration and orientation of a Hall effect element formed therein in accordance with an alternative embodiment of the invention.

It will be recognized that the configuration of FIG. 2 represents the ideal device layout to provide a Hall effect element in which bias current flow is both parallel with the <100> direction and parallel with the edge of the chip and in which component density is maximized by aligning component edges with chip edges. However, where the conventional terminal pattern using bias current input/output terminals and voltage sensing terminals at opposite diagonal corners of the Hall element is preferred, a layout as shown in FIG. 4 may be used. In the configuration of FIG. 4, the lateral edges of the chip 10 are aligned parallel with the <100> crystallographic direction as in FIG. 2. The Hall element 11 is square in plan dimensions but is rotated so that its edges are 45° from the edges of the chip. Bias current input/output terminals 20, 21 are positioned at opposite diagonal corners of the Hall element 11. However, since the edges of the Hall element are 45° from the edges of the chip 10, current flow between terminals 20 and 21 is parallel with the <100> direction. Furthermore, since longitudinal and transverse stresses are applied perpendicular to the edges of the chip, such stresses are applied at 0° or 90° from the direction of bias current flow, thus achieving the same results as the configuration of FIG. 2.

From the foregoing it will be readily recognized that the effects of packaging-induced stress on Hall effect elements in integrated circuit chips can be minimized by proper orientation of the Hall effect element with respect to the crystallographic orientation of the semiconductor integrated circuit chip. Furthermore, while the invention has been described with respect to N-type silicon, it will be readily appreciated that since all semiconductors exhibit piezoresistive characteristics, the same considerations may be applied to integrated circuits made from other semiconductor materials. Accordingly, it will be understood that while the invention has been described with particular reference to specific embodiments thereof, the forms of the invention shown and described in detail are to be taken as preferred embodiments of same and that various changes and modifications may be resorted to without departing from the spirit and scope of the invention as defined by the appended claims.

What is claimed:

1. In an integrated circuit formed in a single crystal semiconductor chip, a Hall effect element substantially rectangular in plan dimensions having two lateral edges thereof aligned substantially parallel with a physical edge of said chip and having bias current contact means arranged to define a path for current flow therebetween in which said current flow is in a direction substantially parallel with a physical edge of said chip and substantially parallel with the <100> crystallographic direction.

2. A Hall effect element as defined in claim 1 wherein said single crystal semiconductor chip is silicon.

3. A Hall effect element comprising:
   (a) a body of single crystal semiconductor material having edges defining a substantially rectangular first major face with two of said edges extending in a direction substantially parallel with the <100> crystallographic direction of said single crystal semiconductor material;
   (b) two bias current terminals positioned on said first major face defining a current path therebetween which is substantially parallel with said two edges and substantially parallel with the <100> crystallographic direction of said single crystal semiconductor material; and
   (c) two voltage potential sensing terminals positioned on said first major face on opposite sides of said current path and substantially equidistant from said bias current terminals.

4. A Hall effect element within a body of single crystal semiconductor material having edges aligned substantially parallel with the <100> crystallographic direction, said Hall effect element having bias current input terminals aligned to define a current path therebetween which is substantially parallel with the <100> crystallographic direction.

5. A Hall effect element as defined in claim 4 wherein said semiconductor material is N-type silicon.

6. A Hall effect element within a body of single crystal semiconductor material wherein the direction of bias current flow in said Hall effect element is substantially parallel with the crystallographic direction in which the piezoresistive shear stress coefficient of said semiconductor material is minimum and wherein the direction of bias current flow is substantially parallel with at least one physical edge of the body of semiconductor material.

7. A Hall effect element as defined in claim 3 wherein said body or single crystal semiconductor material is contained within a larger body of single crystal semiconductor material and wherein said current path between said two bias current terminals is substantially parallel with a physical edge of said larger body of single crystal semiconductor material.

8. In an integrated circuit formed in a single crystal semiconductor chip, a Hall effect element substantially rectangular in plan dimensions having two lateral edges thereof aligned substantially 45 degrees from the <100> crystallographic direction and having bias current contact means arranged to define a path for current flow therebetween in which said current flow is in a direction substantially parallel with a physical edge of said chip and substantially parallel with the <100> crystallographic direction.

9. A Hall effect element as defined in claim 8 wherein said single crystal semiconductor chip is silicon.

* * * * *